United States Patent

Villa et al.

[11] Patent Number: 5,804,970
[45] Date of Patent: Sep. 8, 1998

[54] METHOD AND APPARATUS FOR DETECTION AND ACQUISITION OF AUTOMOTIVE FUEL INJECTOR VOLTAGE SIGNAL PULSE WIDTH

[75] Inventors: Charles N. Villa, San Jose; Claes Georg Andersson, Fremont, both of Calif.

[73] Assignee: Snap-On Technologies, Inc., Lincolnshire, Ill.

[21] Appl. No.: 589,035

[22] Filed: Feb. 12, 1996

[51] Int. Cl.[6] .................. G01R 17/02; G01R 19/257; F02P 17/12
[52] U.S. Cl. .................. 324/379; 324/378; 324/76.12
[58] Field of Search .................. 324/378, 379, 324/76.12, 76.13

[56] References Cited

U.S. PATENT DOCUMENTS

5,017,874  5/1991  Di Nunzio et al. .................. 324/378
5,028,914  7/1991  Povenmire .................. 324/76.12 X
5,194,813  3/1993  Hannah et al. .................. 324/379

*Primary Examiner*—Glenn W. Brown
*Attorney, Agent, or Firm*—Claude A.S. Hamrick

[57] ABSTRACT

A method and apparatus for detecting and displaying automotive fuel injector voltage signal pulse width which includes signal detection circuits for capturing the rising and falling edges of an input signal having positive and negative voltage swings is disclosed. Upon detecting a rising edge or a falling edge of a positive or negative voltage of the input signal, a corresponding software routine is executed to carry out the process of measuring the pulse width of a pulse of the input signal. The measured pulse width is then displayed in numerical and/or histogramic formats.

19 Claims, 6 Drawing Sheets

METHOD AND APPARATUS FOR DETECTION AND ACQUISITION OF AUTOMOTIVE FUEL INJECTOR VOLTAGE SIGNAL PULSE WIDTH

BACKGROUND OF THE INVENTION

1. Field of the Invention

The present invention relates generally to electronic signal measurement apparatus, and more particularly to a system for detection and acquisition of automotive fuel injector voltage signal pulse width regardless of the fuel injector type.

2. Description of the Prior Art

In the automotive repair field, as well as in other fields, it has long been important to have instruments available for measuring electrical signals occurring at various points within the numerous electrical circuits and signal paths resident in an automobile. Measurements of parameters such as current, voltage, resistance, signal frequency, etc. enable a repair technician to locate and diagnose the numerous problems that occur in a vehicle. Such parameters are typically measured using available apparatus ranging from simple voltage, current and resistance-measuring meters to sophisticated, computerized electronic diagnostic equipment.

A signal of particular interest is the voltage signal of a fuel injector, more specifically, the pulse width of the voltage signal as detected at the fuel injector. Fuel injectors of an automobile receives periodic voltage pulses of a duration as specified by the computer module of the automobile. In one operation, the computer module receives a signal from the oxygen sensor indicating the amount of oxygen remaining after combustion of the air-fuel mixture. In response to such a signal, the computer module adjusts the amount of fuel to be injected by the injectors by varying the pulse width of the voltage signal sent to the fuel injectors.

Figures 1A, 2A:
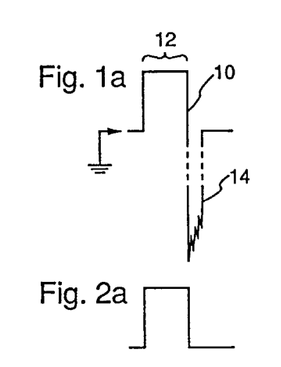
FIGS. 1a–1d illustrate four feed-side controlled pulse types that may be detected at the voltage terminals of a feedside controlled fuel injector.
FIGS. 2a–2d illustrate the detected base portions of the corresponding input signals depicted at FIGS. 1a–1d.
Figures 1B, 2B:
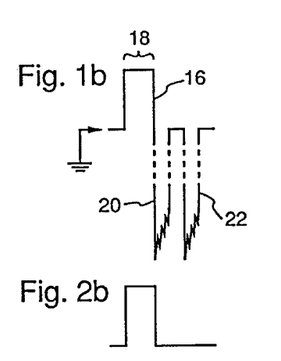
Figures 1C, 2C:
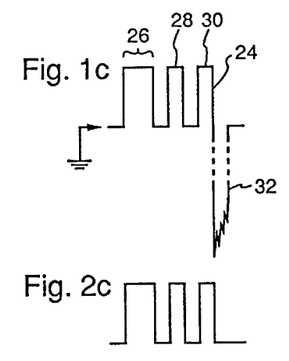
Figures 1D, 2D:
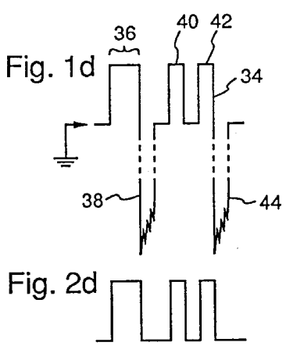
Figure 3A:
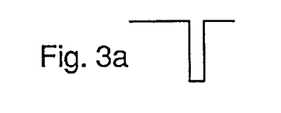
FIGS. 3a–3d show the detected inductive kickback portions for the corresponding input waveforms of FIGS. 1a–1d.
Figure 3B:
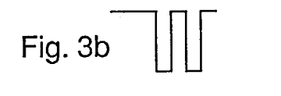
Figure 3C:
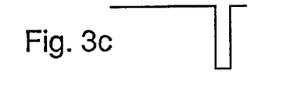
Figure 3D:
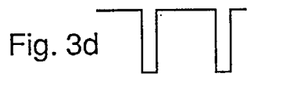

There are generally two activation methods for fuel injectors, feed-side controlled and ground-side controlled. FIGS. 1a–1d illustrate four feed-side controlled pulse types that may be detected at the fuel injector voltage terminals. The ground symbols serves as a reference point for the depicted voltage signals. In FIG. 1a, a Port Fuel Injector (PFI) type pulse 10 comprising of a base pulse 12 and a kickback pulse 14 is illustrated. FIG. 1b illustrates a "peak & hold" or "current limited" pulse 16 comprising of a base pulse 18 and two kickback pulses as indicated at 20 and 22. FIG. 1c illustrates a Modulated with One Kickback pulse 24 comprising of one base pulse 26 immediately followed by two (or more) shorter pulses (28 and 30) and a kickback pulse 32. In FIG. 1d, a Modulated with Two Kickback pulse 34 is comprised of a base pulse 36 followed by a kickback pulse 38, two (or more) shorter pulses (40 and 42), and another kickback pulse 44. Note that the kickback pulses typically are much larger than the base pulses and they are illustrated with broken dots to emphasize the voltage differences.

Figure 4A:
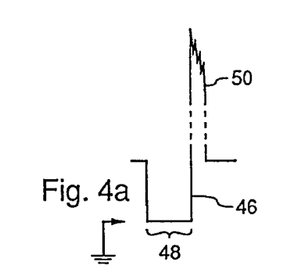
FIGS. 4a–4d illustrate four ground-side controlled pulse types that may be detected at the terminals of a ground-side controlled fuel injector.
Figure 4B:
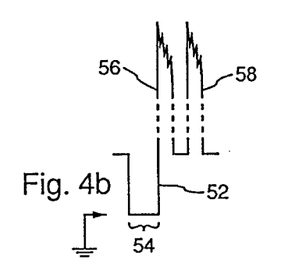
Figure 4C:
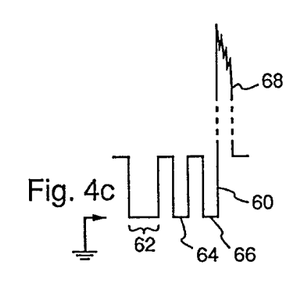
Figure 4D:
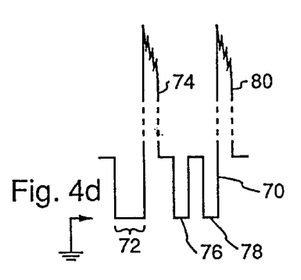
Figure 5A:
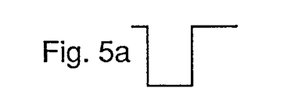
FIGS. 5a–5d illustrate the detected base portions for the corresponding input waveforms of FIGS. 4a–4d.
Figure 5B:
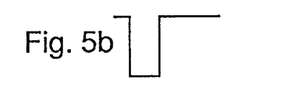
Figure 5C:
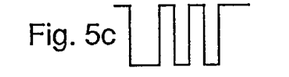
Figure 5D:
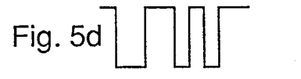
Figure 6A:
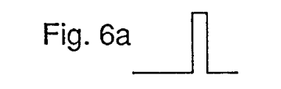
FIGS. 6a–6d show the detected inductive kickback portions for the corresponding input signals of FIGS. 4a–4d.
Figure 6B:
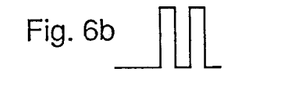
Figure 6C:
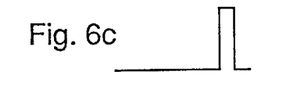
Figure 6D:
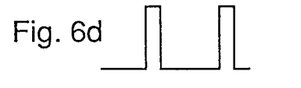

FIGS. 4a–4d illustrate four ground-side pulse types that may be detected at a fuel injector. In FIG. 4a, there is a PFI type pulse 46 with a downward base pulse 48 followed by a kickback pulse 50. In FIG. 4b, there is a "peak & hold" or "limited current" pulse 52 comprising of a base pulse 54 followed by two kickback pulses (56 and 58). FIG. 4c illustrates a Modulated with One Kickback pulse 60 with a base pulse 62 followed immediately by two (or more) shorter pulses (64 and 66) and a kickback pulse 68. In FIG. 4d, a Modulated with Two Kickback pulse 70 is comprised of a base pulse 72 followed by a kickback pulse 74, two (or more) shorter pulses (76 and 78) and another kickback pulse 80. All of the detected kickback pulses are byproducts of the operation of the fuel injector coil and are further explained below.

The number of 'shorter' base pulses on all modulated injectors (1 or 2 kickbacks, feed-side or ground-side) varies with the duration of the total injector event. The duration of the first (wider) base pulse is relatively fixed, and that is the amount of time it takes for the current flowing into the injector to actuate the pintle. To maintain the pintle in the actuated state allowing a greater amount of fuel injected, shorter base pulses are provided. The figures of the voltage signals of the moduled injectors (FIGS. 1c, 1d, 4c, and 4d) depict the waveforms at one particular pulse width (around 2.5 ms). At a short pulse width (around 2 ms), there may only be one shorter pulse; at a longer pulse width (around 5 ms), there may be 6 or 7 shorter pulses. To summarize, the wider base pulse is generally fixed, and the number of shorter base pulses increases or decreases to adjust the total pulse width.

In operating a feed-side controlled injector, a positive voltage signal is applied by the vehicle's computer module which causes a current to flow through the injector coil to produce a magnetic field that activates a pintle to allow fuel to be injected through a valve opening into the combustion chamber of a cylinder. The pulse width of the voltage signal corresponds to the duration or amount of time the pintle remains actuated and therefore the amount of fuel injected into the cylinder. If a high level of oxygen remains after combustion (indicating a 'lean' air-fuel mixture), the oxygen sensor detects and reports such a condition to the computer module and the computer module in response increases the pulse width of the voltage signal sent to the fuel injector and thereby increases the amount of fuel injected into the cylinder. If an undesirably low level of oxygen is detected and reported by the oxygen sensor (indicating a 'rich' air-fuel mixture condition), the computer module in response to such condition decreases the duration of the voltage signal to decrease the amount of fuel injected into the cylinder. Upon turning off the voltage to the injector coil (after the falling edge of the pulse), there is a kickback pulse having a magnitude far exceeding the magnitude of the base pulse due to the collapsing magnetic field within the injector.

Ground-side controlled injectors operate in likewise manner as that of the feed-side controlled injectors with the difference being that the injectors are supplied with constant voltage by the vehicle's electrical system, and the computer module supplies or removes a ground path to the injector to control current flow. When a ground path is supplied to the injector, the pintle is actuated to allow fuel to be injected into the cylinder.

In addition to the signal from the oxygen sensor, the computer module receives other input signals that may cause the computer module to adjust the pulse width of the voltage signal to the fuel injectors in response to the input signals. Thus, by varying an input signal to the computer module known to cause the computer module to adjust the pulse width of the voltage signal to the fuel injectors and by observing the detected voltage signal at a fuel injector, the operation of a number of subsystems can be diagnosed for proper operation.

Prior art measurement systems for observation of injector voltage pulse width modulation proves to be difficult to use or inaccurate. Such systems include oscilloscopes, digital multimeters with capability for measuring pulse width, and digital multimeters with special capability for measuring fuel injector pulse width. For an oscilloscope, the user must manually synchronize the voltage signal from the injector and manually measure and calculate the start and stop times of the pulse event in order to obtain the pulse width. This is a very time consuming process prone to mistakes in the measurement of the pulses.

For digital multimeters featuring capability for measuring pulse width, the measured and displayed values are generally incorrect due to the fact that this type of multimeter typically uses a single-point voltage reference. The pulse width of a fuel injector voltage signal generally comprises one or more base pulses and one or more inductor kickback pulses. A single-point voltage reference measures either the base pulse width or the kickback pulse width but not both, and is therefore unable to correctly detect the true pulse width.

Prior art digital multimeters featuring capability for measuring fuel injector pulse width require the user to first identify whether the injector is a feed-side controlled or ground side controlled injector before connecting the probes of the multimeter to the injector. This additional step of identifying the injector type prior to the using of the multimeter hinders efficient diagnosis of an automobile and requires the user to have a higher knowledge level of the fuel injector system. Additionally, some of these multimeters use pattern matching to identify the pulse type. However, pattern matching methods are unable to detect new pulse types that may be later developed by the automobile manufacturers.

SUMMARY OF THE INVENTION

It is therefore an object of the present invention to provide a method and apparatus for detecting and displaying fuel injector voltage signal pulse width where the type of fuel injector signal is automatically detected.

It is another object of the present invention to provide a method and apparatus for detecting and displaying fuel injector voltage signal pulse width where the user is not required to have any knowledge of fuel injector type.

It is yet another object of the present invention to provide a method and apparatus for detecting and displaying fuel injector voltage signal pulse width where new pulse types can be easily detected without resorting to pattern matching or the use of templates.

Briefly, the present invention is embodied in the form of a hand-held instrument which includes signal detection circuits for capturing the rising (or leading) and falling (or trailing) edges of an input signal having positive and negative voltage swings. Upon detecting a rising edge or a falling edge of a positive or negative voltage of the input signal, a corresponding software routine is executed to carry out the process of measuring the pulse width of a pulse of the input signal. The measured pulse width is then displayed in numerical and/or histogramic formats.

An important advantage of the present invention is that the type of fuel injector signal is automatically detected.

Another advantage of the present invention is that the user is not required to have any knowledge regarding the type of the fuel injector in order to operate the apparatus embodying the present invention.

Still another advantage of the present invention is that new pulse types are easily detected without resorting to pattern matching or templates.

These and other objects and advantages of the present invention will no doubt become apparent to those skilled in the art after having read the following detailed description of the preferred embodiment which is illustrated in the several figures of the drawing.

IN THE DRAWINGS

FIG. 7b depicts the base portion of the voltage signal depicted in FIG. 7a;

FIG. 7c illustrates the detected kickback portion of the voltage signal depicted in FIG. 7a;

DETAILED DESCRIPTION OF THE PREFERRED EMBODIMENTS

Figure 7A:
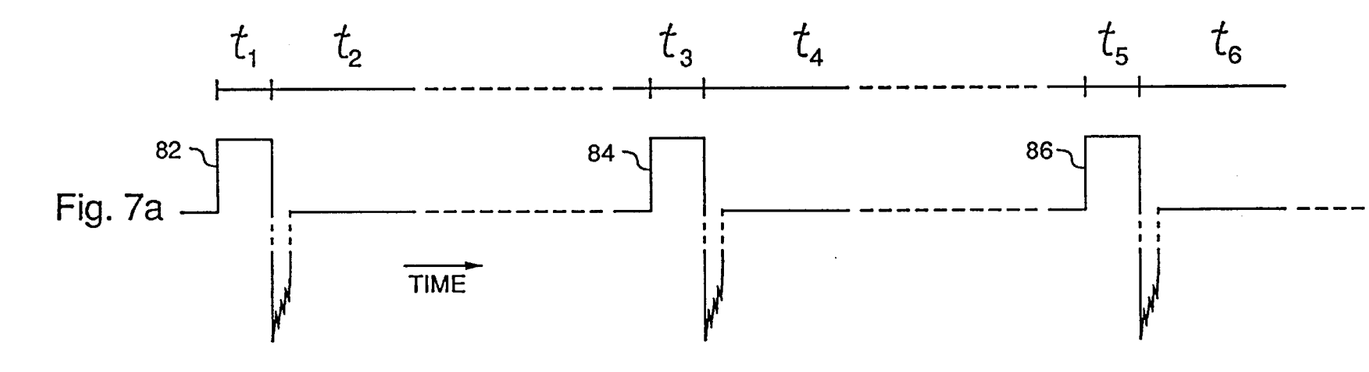
FIG. 7a shows a typical feed-side controlled PFI voltage signal with several pulses over several time periods as detected at the voltage terminals of a fuel injector.

Referring to FIG. 7a, a typical feed-side controlled PFI voltage signal as detected at the voltage terminals of a fuel injector is shown here with several pulses over several time periods. The pulses, 82, 84, and 86 are in time periods t1, t3, and t5. Pulses 82 and 84 are separated by time period t2, and pulses 84 and 86 are separated by time period t4. In a typical pulse period such as t1, t3, or t5, the event time could range from 2 ms to 3 ms at 1000 RPM (idle) engine speed. Under heavy acceleration (high engine load), the event time typically ranges around 20 ms at about 1000 RPM to 2000 RPM. The typical time between events at about 1000 RPM is around 120 ms (based on a typical 4-stroke spark-ignition engine cycle). Under rapid acceleration, the time between events are shortened to a certain extent. Nevertheless, the time lapsed between events is much greater than the event time. Using this information and observing the pulses, it is noted that the start of a pulse event is marked by the occurrence of a base pulse edge after an idle period and the end of a pulse event is marked by the occurrence of a kickback pulse edge followed by an idle period.

Figure 8:
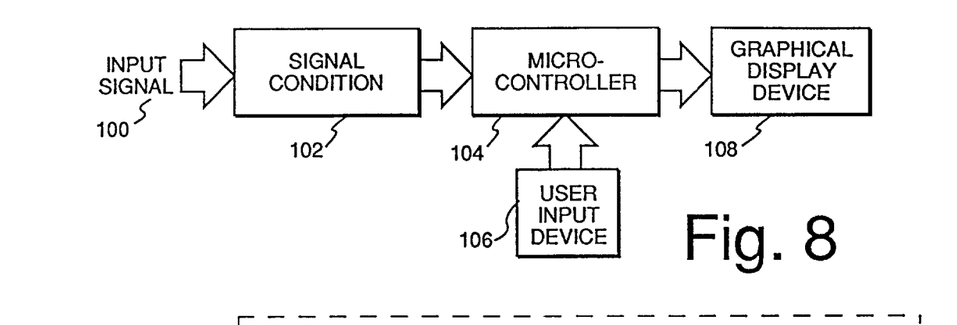
FIG. 8 is a block diagram generally illustrating the principal operative components of the present invention.

The preferred embodiment of the present invention uses such information, detects and calculates the pulse width, and displays the detected pulse width on a display monitor (or LCD/LED). Referring now to FIG. 8, a generalized block diagram, illustrating the major subsystems of the preferred embodiment of the present invention, includes a signal conditioner 102 for receiving and conditioning the input signal 100, a microcontroller 104 for receiving user signals from a user input device 106 and the conditioned input signals from the signal conditioner 102, and a graphical display device 108 for displaying processed signals received from the microcontroller 104.

Figure 9:
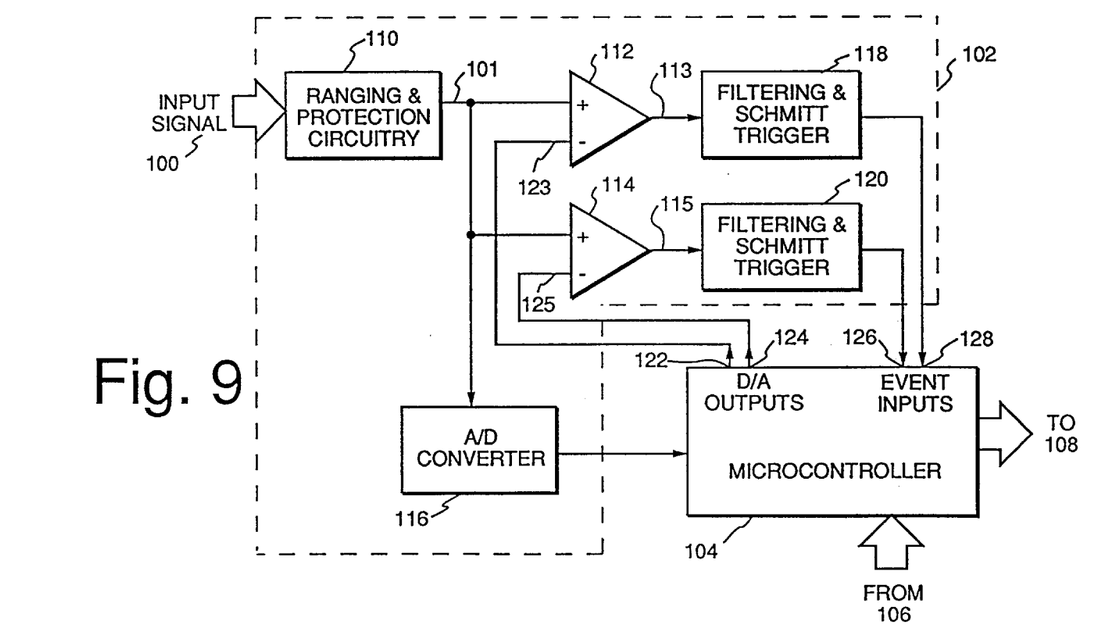
FIG. 9 is a block diagram illustrating in detail the principal functional components of the signal conditioner illustrated in FIG. 8.

As is further expanded in FIG. 9, the signal conditioner 102 is comprised of Ranging and Protection circuitry 110, comparators 112 and 114, and Filtering and Triggering circuits 118 and 120. The protection circuitry protects the circuit from excessive power or power surges and the ranging circuitry adjusts the input voltage to a level acceptable to the downstream circuitry. A typical acceptable signal level is within the range of plus/minus 2.5 volts.

Figures 7B, 7C:
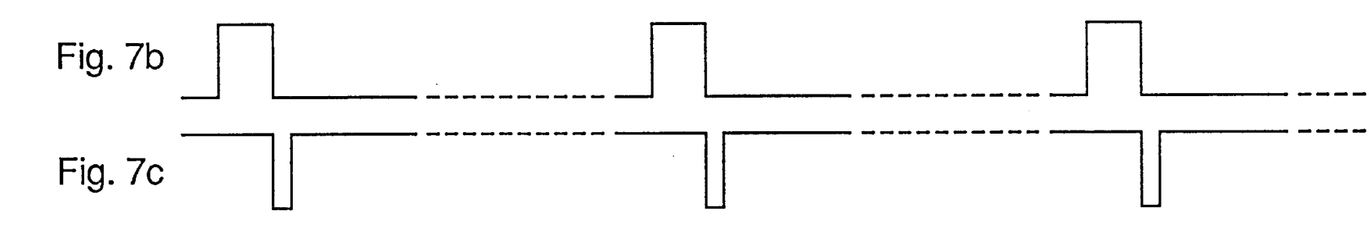

The adjusted input signal 101 from the Ranging and Protection circuitry 110 is then sampled by the analog-to-digital converter 116 to provide digital values for input to the microcontroller. The digital sample values provide a basis for the microcontroller to determine the voltage swing of the adjusted input signal appearing on line 101, and to generate reference threshold voltages at digital/analog output ports 122 and 124 for input to comparator 112 at 123 and comparator 114 at 125. The reference threshold voltages are typically a positive and a negative threshold voltage that the adjusted input signal on line 101 must exceed in order to cause comparator 112 to generate a signal on lines 113 or comparator 114 to generate a signal on line 115. More specifically, comparator 112 detects the base portion of the adjusted input signal appearing on line 101. FIGS. 2a–2d illustrate the detected base portions of the corresponding input signals depicted at FIGS. 1a–1d, and FIGS. 5a–5d illustrate the detected base portion for the corresponding input waveforms of FIGS. 4a–4d. Similarly, FIG. 7b depicts the base portion of FIG. 7a. Comparator 114 detects the inductive kickback portion of the adjusted input signal. For example, FIGS. 3a–3d show the detected inductive kickback portions for the corresponding input waveforms of FIGS. 1a–1d, and FIGS. 6a–6d show the detected inductive kickback portions for the corresponding input signals of FIGS. 4a–4d. FIG. 7c illustrates the detected kickback portion of the signal depicted by FIG. 7a.

The signals generated by the comparators are filtered and the signal edges are made sharp by the Filtering and Trigger circuitries 118 and 120. The signal is then passed on to event input ports 126 and 128 of the microcontroller 104. Note that the threshold voltages are set only once for a particular input signal.

Initially, the microcontroller 104 evaluates the digital sample values received from A/D converter 116 over a certain period of time, determines whether the voltage signal is a feed-side controlled signal or a ground-side controlled signal, and sets the threshold voltage levels that the adjusted input voltage on line 101 must exceed in order to be detected as a rising edge (or a falling edge).

To identify whether the signal is a feed-side voltage signal or a ground-side voltage signal, the microcontroller looks at the digital sample values representing the adjusted input signal appearing on line 101. A feed-side signal is typically at near-zero voltage while the injector is 'off', rises to vehicle battery voltage when 'on' (reflecting the base pulse (s)), and drops to about negative 30 to 40 volts due to the inductive kickback spikes. The microcontroller can thus determine a feed-side signal from the maximum and minimum voltages observed (typically +12 volts to around −40 volts). Similarly, for ground-side controlled signals, the observed signal is typically at vehicle battery voltage while 'off', drops to near-zero voltage while 'on', and inductive kickbacks result in peaks near positive 50 to 60 volts. The microcontroller is able to determine a ground-side signal by observing signals in the range of 0 volt to +60 volts.

After determining the injector type, the microcontroller 104 then sets an appropriate threshold voltage for comparator 112 and a threshold voltage for comparator 114 where each threshold voltage is at a sufficient level to identify the occurrence of an edge. Should the adjusted input signal on line 101 exceed either of the threshold voltages it will cause the corresponding comparator to generate a signal which is then filtered and pulse shaped by the Filtering and Trigger circuitry 118 or 120. The microcontroller then receives the processed signal at event input port 126 or 128 as a signal event.

The microcontroller upon receiving the event signals identifies a rising edge or a falling edge and executes the corresponding software routine depicted in the flow charts of FIGS. 10a–10d and 11a–11d in accordance with another aspect of the present invention. In implementing the algorithm, two count-down timers, timer1 and timer2, are maintained where a timer1 or timer2 interrupt is triggered when the corresponding count-down timer has reached zero. Timer1 is used to determine the end of an event, and timer2 is used to measure the pulse width. The two event signals are referred to as event1 and event2 signals in the following description where event1 refers to the base portion of a signal and event2 refers to the kickback portion.

The microcontroller having already determined the input voltage signal as a feed-side controlled or a ground-side controlled voltage signal selects the corresponding set of software routines to process the signals received from the event input ports. For a feed-side controlled signal, referring to FIG. 10a, the initialization step sets event1 and event2 to interrupt on rising edges (meaning that only a rising edge will trigger a corresponding software routine and no action will be taken on a falling edge), and both timers are turned off. Upon receiving an event1 rising edge interrupt, referring to FIG. 10b, the event1 interrupt is reset to trigger on a falling edge as indicated at 132. Moreover, if timer2 is not active (138), event2 is set to interrupt on falling edges, timer2 is initialized and started. If timer2 has been active (136), the last recorded time stamp for the occurrence of event2 is taken as the pulse width and is transferred to storage for later use. Timer2 is then cleared, initialized, and restarted again.

Figure 10A:
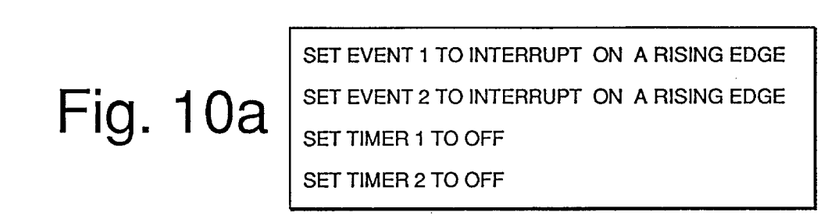
FIGS. 10a–10d illustrate the processing steps for a feed-side controlled voltage signal.
Figure 10B:
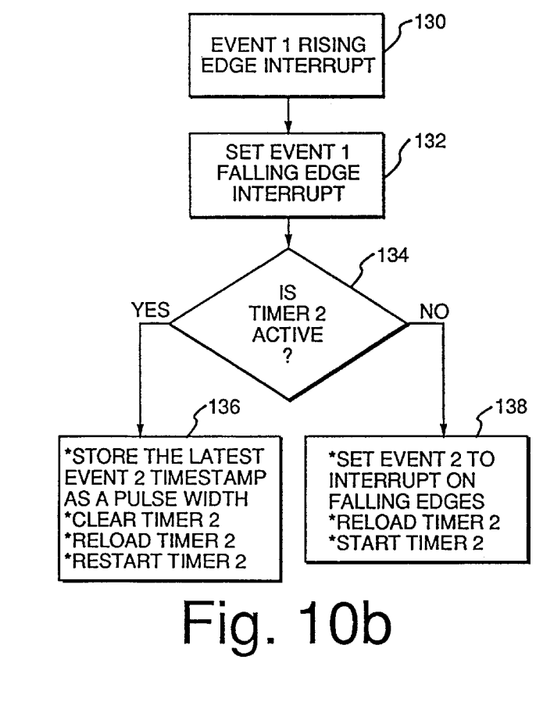
Figure 10C:
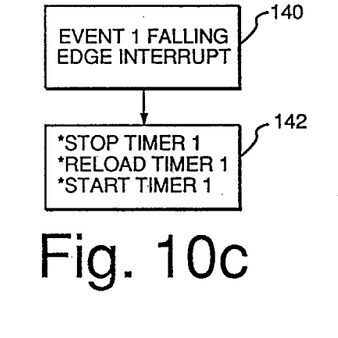

If an event1 falling edge interrupt is triggered, referring to FIG. 10c, timer1 is stopped, reloaded to expire at some point in the future where no further event interrupts are expected, and restarted as indicated at box 142.

Figure 10D:
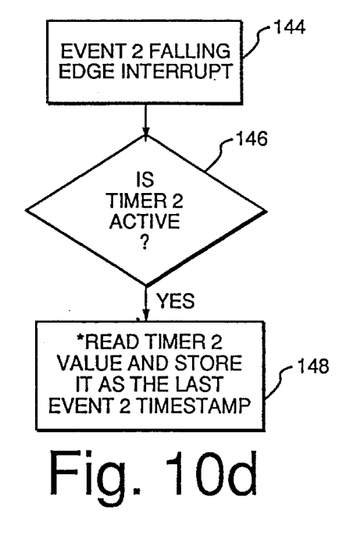
Figure 11A:
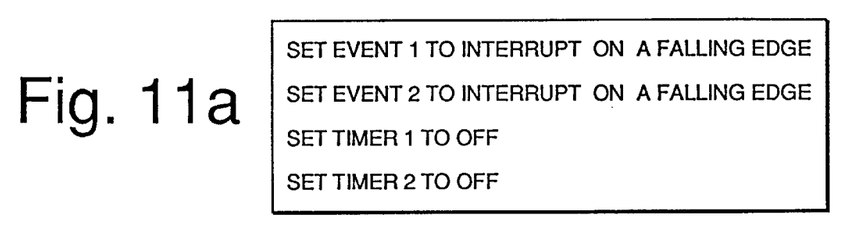
FIGS. 11a–11d similarly illustrate the processing steps for a ground-side controlled voltage signal.
Figure 11B:
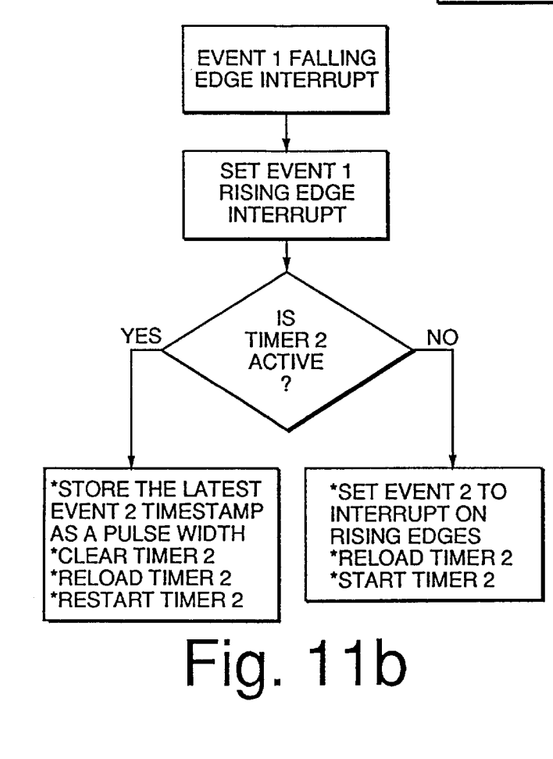
Figure 11C:
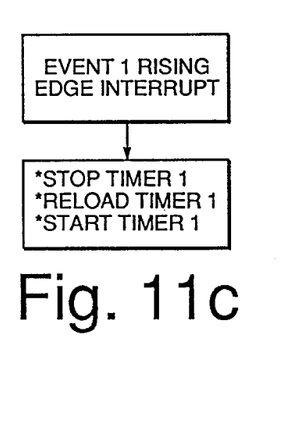
Figure 11D:
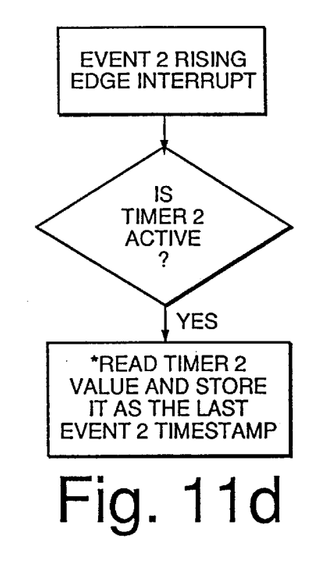

Upon receiving an event2 falling edge, the routine as depicted in FIG. 10d is executed. If timer2 is active, the time of timer2 is recorded as the latest event2 time-stamp. If timer2 is not active, no action is taken. Note that no action is taken for an event2 rising edge interrupt.

In the event that a timer1 interrupt occurs due to the fact that timer1 has counted down to zero, timer1 is stopped and event1 is reset to trigger on a rising edge. The occurrence of timer1 interrupt indicates that a prescribed amount of time has elapsed without receiving any event1 edges, and so the next rising edge indicates the start of a new pulse event.

In the event that a timer2 interrupt occurs due to the fact that timer2 has counted down to zero, this indicates the duration of the pulse event has exceeded the timer2 maximum count; a 'carry' or rollover register is incremented to count the number of times this occurs, and timer2 is restarted. In the preferred embodiment of the present invention, timer1 is typically initialized to 5 ms and timer2 is typically initialized to 21 ms.

For a ground-side controlled signal, referring to FIGS. 11a –11d, the algorithm is the same as that of the algorithm for a feed-side controlled signal except that what was triggered on rising edges now triggers on falling edges and what was triggered on falling edges now triggers on rising edges.

Figure 12:
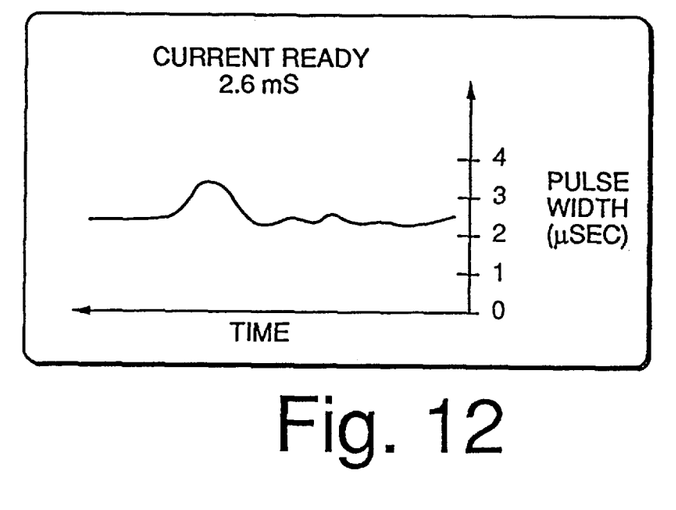
FIG. 12 shows a depiction of the detected pulse width in numerical and histogramic formats.

The detected pulse width stored in memory is processed and displayed on the monitor. Referring to FIG. 12, the resulting pulse width is either displayed numerically or in a histograph showing pulse width variation over time. As an alternate display mode, average pulse width over specified duration can be calculated and displayed.

As actually implemented, the present invention forms part of a graphing, digital multimeter and diagnostic database instrument manufactured by Balco, a division of Snap-on Incorporated, of San Jose, Calif. It will be appreciated, however, that the invention could be embodied as a stand-alone unit or as a component part of another indicator or diagnostic system.

Furthermore, although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What I claim is:

1. A system for detecting, calculating, and displaying the event time of pulse events of variable duration appearing in an input signal, each of the pulse events having two or more pulses, comprising:

signal ranging means for receiving said input signal and generating therefrom an adjusted input signal having voltage levels within a predetermined voltage range;

analog-to-digital converter means for sampling said adjusted input signal to generate digital values representative thereof;

first comparator means for comparing said adjusted input signal and a first threshold voltage magnitude to generate a first event signal each time a first pulse appearing on said adjusted input signal has a voltage magnitude exceeding said first threshold voltage magnitude, the first event signal having a leading edge and a trailing edge defining a pulse width corresponding to the pulse width of said first pulse;

second comparator means for comparing said adjusted input signal and a second threshold voltage magnitude to generate a second event signal each time a second pulse appearing on said adjusted input signal has a voltage magnitude exceeding said second threshold voltage magnitude, the second event signal having a leading edge and a trailing edge defining a pulse width corresponding to the pulse width of said second pulse;

graphical display means; and microcontroller means for receiving said digital values and for determining said first threshold voltage magnitude as a function of a first magnitude of said digital values, and said second threshold voltage magnitude as a function of a second magnitude of said digital values, for receiving the first event signal and the second event signal, and for monitoring the occurrence of each of the first event signal and the second event signal, said microcontroller means calculating the event time of the pulse event as a function of the occurrence of the first event signal and the second event signal, and passing said event time to said graphical display means for display.

2. A system as recited in claim 1 wherein said microcontroller means coordinates one or more times to measure the event time for a pulse event upon receiving the first event signal and the second event signal each having a leading edge and a trailing edge.

3. A system as recited in claim 2 wherein, before measuring the event time, said microcontroller initializes a first timer to an inactive state, and initiates a second timer to an inactive state, and causes a first interrupt to occur upon receiving the leading edge of a first event signal, and causes a second interrupt to occur upon receiving the leading edge of a second event signal.

4. A system as recited in claim 3 wherein, upon occurence of said first interrupt, indicating receipt of the leading edge of a first event signal, said microcontroller re-sets said first interrupt to next occur at the trailing edge of said first event signal; if said second timer is not active, said microcontroller sets said second interrupt to occur upon receiving the leading edge of said second event signal, and reloads and restarts said second timer; and if said second timer is active, said microcontroller records an elapsed time record as the event time for the pulse event and reloads and starts said second timer.

5. A system as recited in claim 4 wherein, upon occurence of said first interrupt indicating receipt of the trailing edge of a first event signal, said microcontroller reloads and restarts said first timer, said first timer determining the end of a pulse event by counting down from a preset amount of time and causing a first timer interrupt to occur when said first timer counts down to zero.

6. A system as recited in claim 5 wherein, upon occurrence of said second interrupt indicating receipt of the leading edge of a second event signal, if said second timer is active, said microcontroller updates the elapsed time record of said second timer.

7. A system as recited in claim 6 wherein, upon occurence of said first timer interrupt, said microcontroller means sets said first interrupt to occur upon receiving the leading edge of a first event signal, and stops said first timer.

8. A system as recited in claim 7 and further including a memory unit for storing the event time of the pulse events.

9. A system as recited in claim 8 wherein said microcontroller calculates an average event time value over a specified period of time from the event time values in said memory unit and passes said average event time value to said graphical display means for display.

10. A system as recited in claim 1 where said first pulse is a base pulse of the pulse event, and said second pulse is a kickback pulse of the pulse event.

11. A system as recited in claim 1 and further including a user input means operatively connected to said microcontroller means for specifying input parameters including display modes.

12. A system as recited in claim 1 and further including a filter means operatively connecting said first comparator means to said microcontroller means for filtering the first event signal before passing the first event signal to said microcontroller means.

13. A system as recited in claim 1 and further including a filter means operatively connecting said second comparator means to said microcontroller means for filtering the second event signal before passing the second event signal to said microcontroller means.

14. A system as recited in claim 1 and further including a first Schmitt Trigger means operatively connecting said first comparator means to said microcontroller means for sharpening the edge of the first event signal before passing the first event signal to said microcontroller means.

15. A system as recited in claim 14 and further including a second Schmitt Trigger means operatively connecting said second comparator means to said microcontroller means for sharpening the edge of the second event signal before passing the second event signal to said microcontroller means.

16. A system as recited in claim 1 wherein said signal ranging means includes circuit protection means to prevent said input signal from damaging the system.

17. A system as recited in claim 1 and further including a memory unit for storing the event time of the pulse events.

18. A method for detecting, calculating and displaying the event time of pulse events of variable duration appearing in an input signal each of the pulse events having two or more pulses comprising the steps of:

(a) receiving and adjusting said input signal to a predetermined voltage range;

(b) sampling said adjusted input signal to generate digital values representative thereof:

(c) determining from said digital values a first threshold voltage magnitude and a second threshold voltage magnitude having predetermined relationships to particular characteristics of said input signal;

(d) comparing said adjusted input signal and said first threshold voltage magnitude to generate a first event signal each time said adjusted input signal exceeds said first threshold voltage magnitude, and comparing said adjusted input signal and said second threshold voltage magnitude to generate a second event signal each time said adjusted input signal exceeds said second threshold voltage magnitude:

(e) measuring the event time of a pulse event as a function of the time of the occurrence of the first event signal and the second event signal, and (f) displaying the event time.

19. A method as recited in claim 18 wherein said first event signal and said second event signal each have a leading edge and a trailing edges and said step (e) further includes the substeps of:

i) initializing a first interrupt to occur upon receiving the leading edge of a first event signal, and a second interrupt to occur upon receiving the leading edge of a second event signal, and setting a first timer and a second timer to inactive states;

ii) upon occurrence of a first interrupt, indicating receipt of the leading edge of a first event signal, re-setting said first interrupt to occur upon receiving the trailing edge of a first event signal, if said second timer is not active, re-setting said second interrupt to occur upon receiving the trailing edge of a second event signal, and reloading and restarting said second timer, and if said second timer is active, storing an elapsed time record as the event time for the pulse event, and reloading and restarting said second timer;

iii) upon occurrence of a subsequent first interrupt, indicating receipt of the trailing edge of a first event signal, reloading and restarting said first timer to count down from a preset amount of time, said first timer causing a first timer interrupt to occur when said first timer counts to zero;

iv) upon occurrence of said second interrupt, indicating receipt of the leading edge of a second event signal, if said second timer is active, updating said elapsed time record with the time value from said second timer;

v) upon occurrence of a first timer interrupt indicating expiration of time on said first timer, re-setting said first interrupt to occur on receiving the leading edge of a first event signal and stopping said first timer; and vi) repeating said steps ii)–v) for a selectable period of time.

* * * * *